(12) United States Patent
Zettel et al.

(10) Patent No.: US 7,538,520 B2
(45) Date of Patent: May 26, 2009

(54) METHOD AND APPARATUS FOR QUANTIFYING QUIESCENT PERIOD TEMPERATURE EFFECTS UPON AN ELECTRIC ENERGY STORAGE DEVICE

(75) Inventors: Andrew M. Zettel, Ann Arbor, MI (US); Anthony H. Heap, Ann Arbor, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 305 days.

(21) Appl. No.: 11/422,610

(22) Filed: Jun. 7, 2006

(65) Prior Publication Data

US 2007/0285063 A1    Dec. 13, 2007

(51) Int. Cl.
*H02J 7/04*    (2006.01)
*H02J 7/16*    (2006.01)

(52) U.S. Cl. .................. 320/150; 320/153; 700/299; 324/431

(58) Field of Classification Search ............... 320/150, 320/153, 155; 700/91, 299; 324/431
See application file for complete search history.

(56) References Cited

U.S. PATENT DOCUMENTS

| 4,803,987 A | 2/1989 | Calfee et al. |
| 5,847,469 A | 12/1998 | Tabata et al. |
| 6,124,698 A * | 9/2000 | Sakakibara ............. 320/110 |
| 2006/0012378 A1 * | 1/2006 | Yurgil ..................... 324/548 |
| 2006/0076831 A1 | 4/2006 | Meyers et al. |
| 2007/0285060 A1 | 12/2007 | Zettel et al. |

\* cited by examiner

*Primary Examiner*—Akm E Ullah
*Assistant Examiner*—Arun Williams

(57) ABSTRACT

A electrical energy storage device may experience quiescent periods of operation. A method is disclosed effective to account for the effects that temperature during quiescent periods has upon the electrical energy storage device.

16 Claims, 3 Drawing Sheets

METHOD AND APPARATUS FOR QUANTIFYING QUIESCENT PERIOD TEMPERATURE EFFECTS UPON AN ELECTRIC ENERGY STORAGE DEVICE

TECHNICAL FIELD

This invention pertains generally to life expectancy of an electrical energy storage device. More particularly, the invention is concerned with the effects that periods of rest have upon such life expectancy.

BACKGROUND OF THE INVENTION

Various hybrid powertrain systems use electrical energy storage devices to supply electrical energy to electrical machines, which are operable to provide motive torque, often in conjunction with an internal combustion engine. One such hybrid powertrain architecture comprises a two-mode, compound-split, electro-mechanical transmission which utilizes an input member for receiving power from a prime mover power source and an output member for delivering power from the transmission to a vehicle driveline. First and second electric machines, i.e. motor/generators, are operatively connected to an energy storage device for interchanging electrical power therebetween. A control unit is provided for regulating the electrical power interchange between the energy storage device and the electric machines. The control unit also regulates electrical power interchange between the first and second electric machines.

One of the design considerations in vehicle powertrain systems is an ability to provide consistent vehicle performance and component/system service life. Hybrid vehicles, and more specifically the battery pack systems utilized therewith, provide vehicle system designers with new challenges and tradeoffs. It has been observed that service life of an electrical energy storage device, e.g. a battery pack system, increases as resting temperature of the battery pack decreases. However, cold operating temperature introduces limits in battery charge/discharge performance until temperature of the pack is increased. A warm battery pack is more able to supply required power to the vehicle propulsion system, but continued warm temperature operation may result in diminished service life.

Modern hybrid vehicle systems manage various aspects of operation of the hybrid system to effect improved service life of the battery. For example, depth of battery discharge is managed, amp-hour (A-h) throughput is limited, and convection fans are used to cool the battery pack. Ambient environmental conditions in which the vehicle is operated has largely been ignored. However, the ambient environmental conditions may have significant effect upon battery service life. Specifically, same models of hybrid vehicles released into various geographic areas throughout North America would likely not result in the same battery pack life, even if all the vehicles were driven on the same cycle. The vehicle's environment must be considered if a useful estimation of battery life is to be derived. Additionally, customer expectations, competition and government regulations impose standards of performance, including for service life of battery packs, which must be met.

End of service life of a battery pack may be indicated by ohmic resistance of the battery pack. The ohmic resistance of the battery pack is typically flat during much of the service life of the vehicle and battery pack however, thus preventing a reliable estimate of real-time state-of-life ('SOL') of the battery pack throughout most of the service life. Instead, ohmic resistance is most useful to indicate incipient end of service life of the battery pack.

Furthermore, service life of a battery pack is affected by resting temperature, i.e. life of a battery pack system increases as resting temperature of the battery pack decreases. Therefore a battery pack control system that is operable to determine a state-of-life of a monitored battery pack would benefit from a parametric value that is indicative of an effect of temperature of the battery pack during quiescent or stasis periods. Such quiescent periods occur when the battery pack is neither charging nor discharging, e.g. when a hybrid vehicle using the battery pack is shutdown.

Therefore, it would be useful to have a method and apparatus which determines an effect of temperature during a quiescent period on life expectancy of a battery pack for a hybrid vehicle.

SUMMARY OF THE INVENTION

A method to determine an effect of temperature during a quiescent period of an electrical energy storage device operation upon life expectancy of an electrical energy storage device includes determining a weighted average temperature of the electrical energy storage device during the quiescent period. The weighted average temperature is based upon an average temperature of the electrical energy storage device during the quiescent period and a temperature of the electrical energy storage device substantially contemporaneous with the start of the quiescent period. Further, the method includes determining a resting temperature factor for the electrical energy storage device based upon the weighted average temperature of the electrical energy storage device during the quiescent period.

BRIEF DESCRIPTION OF THE DRAWINGS

The invention may take physical form in certain parts and arrangement of parts, an embodiment of which is described in detail and illustrated in the accompanying drawings which form a part hereof, and wherein.

DETAILED DESCRIPTION OF AN EMBODIMENT OF THE INVENTION

Figure 1:
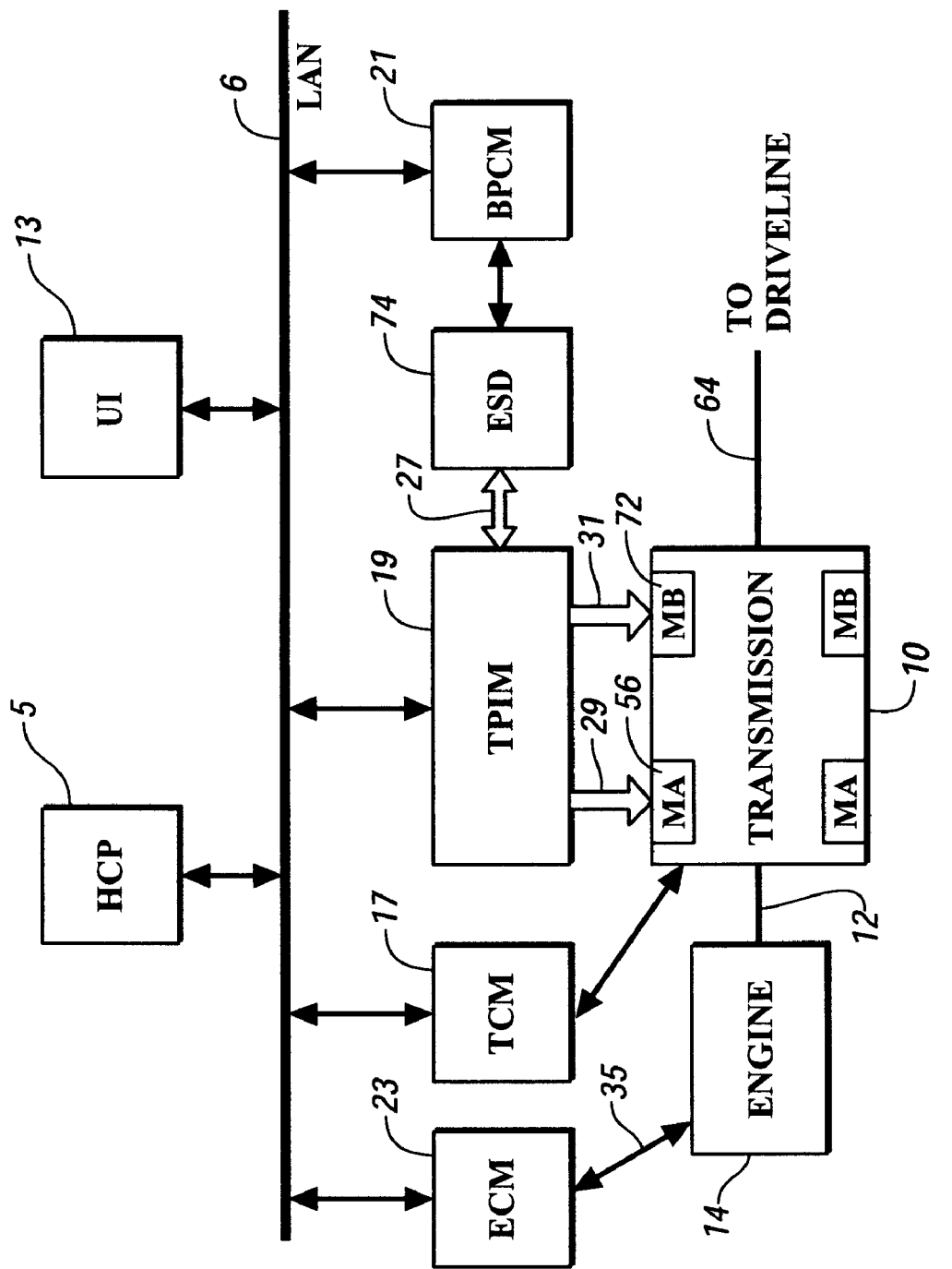
FIG. 1 is a schematic diagram of an exemplary architecture for a control system and powertrain, in accordance with the present invention.

Referring now to the drawings, wherein the showings are for the purpose of illustrating the invention only and not for the purpose of limiting the same, FIG. 1 shows a control system and an exemplary hybrid powertrain system which has been constructed in accordance with an embodiment of the invention. The exemplary hybrid powertrain system comprises a plurality of torque-generative devices operable to supply motive torque to a transmission device, which supplies motive torque to a driveline. The torque-generative devices preferably comprise an internal combustion engine 14 and first and second electric machines 56, 72 operable to convert electrical energy supplied from an electrical storage device (ESD) 74 to motive torque. It is understood that ESD may include one or more batteries or alternative electrical energy storage apparatus. The exemplary transmission device 10 comprises a two-mode, compound-split electro-mechanical transmission having four fixed gear ratios and two continuously variable operating modes, and includes a plurality of gears operable to transmit the motive torque to an output shaft 64 and driveline through a plurality of torque-transfer devices contained therein. Mechanical aspects of exemplary transmission 10 are disclosed in detail in U.S. Pat. No. 6,953,409, entitled "Two-Mode, Compound-Split, Hybrid Electro-Mechanical Transmission having Four Fixed Ratios", which is incorporated herein by reference.

The control system comprises a distributed control module architecture interacting via a local area communications network to provide ongoing control to the powertrain system, including the engine 14, the electrical machines 56, 72, and the transmission 10.

The exemplary powertrain system been constructed in accordance with an embodiment of the present invention. The hybrid transmission 10 receives input torque from torque-generative devices, including the engine 14 and the electrical machines 56, 72, as a result of energy conversion from fuel or electrical potential stored in electrical energy storage device (ESD) 74. The ESD 74 typically comprises one or more batteries. Other electrical energy storage devices that have the ability to store electric power and dispense electric power may be used in place of the batteries without altering the concepts of the present invention. The ESD 74 is preferably sized based upon factors including regenerative requirements, application issues related to typical road grade and temperature, and, propulsion requirements such as emissions, power assist and electric range. The ESD 74 is high voltage DC-coupled to transmission power inverter module (TPIM) 19 via DC lines referred to as transfer conductor 27. The TPIM 19 transfers electrical energy to the first electrical machine 56 by transfer conductors 29, and the TPIM 19 similarly transfer electrical energy to the second electrical machine 72 by transfer conductors 31. Electrical current is transferable between the electrical machines 56, 72 and the ESD 74 in accordance with whether the ESD 74 is being charged or discharged. TPIM 19 includes the pair of power inverters and respective motor control modules configured to receive motor control commands and control inverter states therefrom for providing motor drive or regeneration functionality.

The electrical machines 56, 72 preferably comprise known motors/generator devices. In motoring control, the respective inverter receives current from the ESD and provides AC current to the respective motor over transfer conductors 29 and 31. In regeneration control, the respective inverter receives AC current from the motor over the respective transfer conductor and provides current to the DC lines 27. The net DC current provided to or from the inverters determines the charge or discharge operating mode of the electrical energy storage device 74. Preferably, Motor A 56 and Motor B 72 are three-phase AC electrical machines and the inverters comprise complementary three-phase power electronic devices.

The elements shown in FIG. 1, and described hereinafter, comprise a subset of an overall vehicle control architecture, and are operable to provide coordinated system control of the powertrain system described herein. The control system is operable to gather and synthesize pertinent information and inputs, and execute algorithms to control various actuators to achieve control targets, including such parameters as fuel economy, emissions, performance, driveability, and protection of hardware, including batteries of ESD 74 and motors 56, 72. The distributed control module architecture of the control system comprises an engine control module ('ECM') 23, transmission control module ('TCM') 17, battery pack control module ('BPCM') 21, and the Transmission Power Inverter Module ('TPIM') 19. A hybrid control module ('HCP') 5 provides overarching control and coordination of the aforementioned control modules. There is a User Interface ('UI') 13 operably connected to a plurality of devices through which a vehicle operator typically controls or directs operation of the powertrain, including the transmission 10. Exemplary vehicle operator inputs to the UI 13 include an accelerator pedal, a brake pedal, transmission gear selector, and, vehicle speed cruise control. Within the control system, each of the aforementioned control modules communicates with other control modules, sensors, and actuators via a local area network ('LAN') communications bus 6. The LAN bus 6 allows for structured communication of control parameters and commands between the various control modules. The specific communication protocol utilized is application-specific. By way of example, one communications protocol is the Society of Automotive Engineers standard J1939. The LAN bus and appropriate protocols provide for robust messaging and multi-control module interfacing between the aforementioned control modules, and other control modules providing functionality such as antilock brakes, traction control, and vehicle stability.

The HCP 5 provides overarching control of the hybrid powertrain system, serving to coordinate operation of the ECM 23, TCM 17, TPIM 19, and BPCM 21. Based upon various input signals from the UI 13 and the powertrain, the HCP 5 generates various commands, including: an engine torque command, clutch torque commands, for various clutches of the hybrid transmission 10; and motor torque commands, for the electrical machines A and B, respectively.

The ECM 23 is operably connected to the engine 14, and functions to acquire data from a variety of sensors and control a variety of actuators, respectively, of the engine 14 over a plurality of discrete lines collectively shown as aggregate line 35. The ECM 23 receives the engine torque command from the HCP 5, and generates an axle torque request. For simplicity, ECM 23 is shown generally having bi-directional interface with engine 14 via aggregate line 35. Various parameters that are sensed by ECM 23 include engine coolant temperature, engine input speed to the transmission, manifold pressure, ambient air temperature, and ambient pressure. Various actuators that may be controlled by the ECM 23 include fuel injectors, ignition modules, and throttle control modules.

The TCM 17 is operably connected to the transmission 10 and functions to acquire data from a variety of sensors and provide command control signals, i.e. clutch torque commands to the clutches of the transmission.

The BPCM 21 interacts with various sensors associated with the ESD 74 to derive information about the state of the ESD 74 to the HCP 5. Such sensors comprise voltage and electrical current sensors, as well as ambient sensors operable to measure operating conditions of the ESD 74 including, e.g., temperature and resistance measured across terminals of the ESD 74 (not shown). Sensed parameters include ESD voltage, $V_{BAT}$, ESD current, $I_{BAT}$, and ESD temperature, $T_{BAT}$. Derived parameters preferably include ESD current, $I_{BAT}$, ESD internal, $R_{BAT}$, as may be measured across terminals of the ESD, ESD state of charge, SOC, and other states of the ESD, including available electrical power, $P_{BAT\_MIN}$ and $P_{BAT\_MAX}$.

The Transmission Power Inverter Module (TPIM) 19 includes the aforementioned power inverters and motor control modules configured to receive motor control commands and control inverter states therefrom to provide motor drive or regeneration functionality. The TPIM 19 is operable to generate torque commands for machines A and B based upon input from the HCP 5, which is driven by operator input through UI 13 and system operating parameters. Motor torques are implemented by the control system, including the TPIM 19, to control the machines A and B. Individual motor speed signals are derived by the TPIM 19 from the motor phase information or conventional rotation sensors. The TPIM 19 determines and communicates motor speeds to the HCP 5.

Each of the aforementioned control modules of the control system is preferably a general-purpose digital computer generally comprising a microprocessor or central processing unit, read only memory (ROM), random access memory (RAM), electrically programmable read only memory (EPROM), high speed clock, analog to digital (A/D) and digital to analog (D/A) circuitry, and input/output circuitry and devices (I/O) and appropriate signal conditioning and buffer circuitry. Each control module has a set of control algorithms, comprising resident program instructions and calibrations stored in ROM and executed to provide the respective functions of each computer. Information transfer between the various computers is preferably accomplished using the aforementioned LAN 6.

Algorithms for control and state estimation in each of the control modules are typically executed during preset loop cycles such that each algorithm is executed at least once each loop cycle. Algorithms stored in the non-volatile memory devices are executed by one of the central processing units and are operable to monitor inputs from the sensing devices and execute control and diagnostic routines to control operation of the respective device, using preset calibrations. Loop cycles are typically executed at regular intervals, for example each 3.125, 6.25, 12.5, 25 and 100 milliseconds during ongoing engine and vehicle operation. Alternatively, algorithms may be executed in response to occurrence of an event.

The action described hereinafter occurs during active operation of the vehicle, i.e. that period of time when operation of the engine and electrical machines are enabled by the vehicle operator, typically through a 'key-on' action. Quiescent periods include periods of time when operation of the engine and electrical machines are disabled by the vehicle operator, typically through a 'key-off' action. In response to an operator's action, as captured by the UI 13, the supervisory HCP control module 5 and one or more of the other control modules determine required transmission output torque, $T_O$. Selectively operated components of the hybrid transmission 10 are appropriately controlled and manipulated to respond to the operator demand. For example, in the exemplary embodiment shown in FIG. 1, when the operator has selected a forward drive range and manipulates either the accelerator pedal or the brake pedal, the HCP 5 determines how and when the vehicle is to accelerate or decelerate. The HCP 5 also monitors the parametric states of the torque-generative devices, and determines the output of the transmission required to effect a desired rate of acceleration or deceleration. Under the direction of the HCP 5, the transmission 10 operates over a range of output speeds from slow to fast in order to meet the operator demand.

Figure 2:
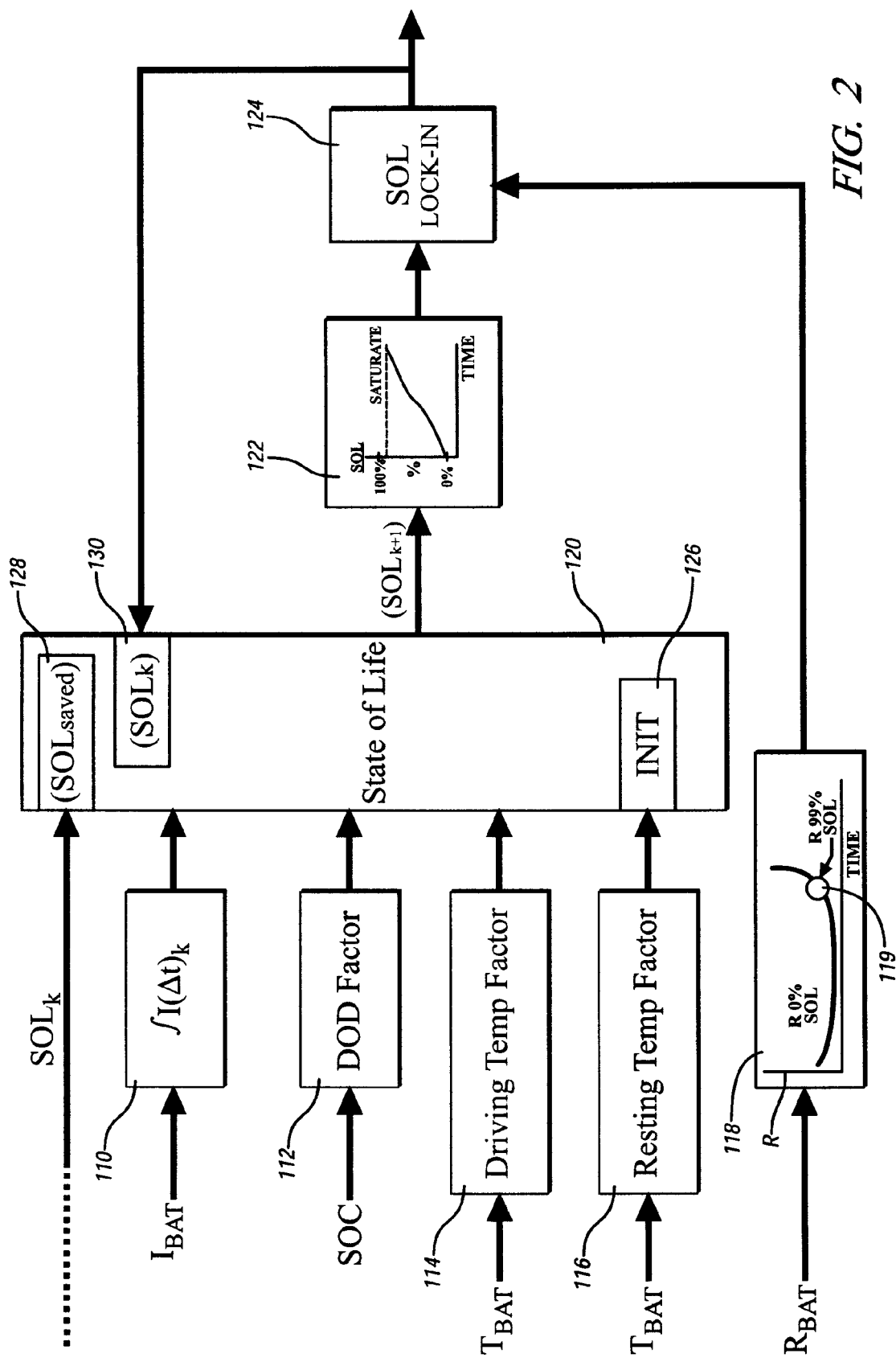
FIG. 2 is an algorithmic block diagram, in accordance with the present invention; and, FIGS. 3 and 4 are exemplary data graphs, in accordance with the present invention.

Referring now to FIG. 2, a schematic diagram is shown, demonstrating an exemplary method for estimating a state of life of the ESD 74 in real-time, based upon monitored inputs. The method is preferably executed as one or more algorithms in one of the controllers of the control system, typically the HCP 5. The estimated state of life of the ESD 74 ('$SOL_K$') is preferably stored as a scalar value in a non-volatile memory location for reference, updating, and for resetting, each occurring at appropriate points during life of the vehicle and the ESD 74.

The exemplary method and apparatus to estimate state-of-life ('SOL') of the energy storage device in the hybrid control system in real-time is disclosed in detail in U.S. patent application Ser. No. 11/422,652, entitled "Method and Apparatus for Real-Time Life Estimation of an Electric Energy Storage Device", which is incorporated herein by reference. The exemplary method and apparatus to estimate state-of-life comprises an algorithm that monitors in real-time an ESD current $I_{BAT}$ (in amperes), an ESD temperature $T_{BAT}$, an ESD voltage $V_{BAT}$, an ESD ohmic resistance $R_{BAT}$, and a ESD State-of-Charge factor ('SOC'). These parameters, $I_{BAT}$, $T_{BAT}$, $V_{BAT}$, and $R_{BAT}$, are used to determine a parametric value for ESD current integrated over time 110, a parametric value for depth of discharge factor 112, a parametric value for driving temperature factor 114, and, a parametric value for resting temperature factor $T_{REST}$ 116.

Each of the aforementioned factors, i.e. the integrated ESD current, depth of discharge, driving temperature factor, and resting temperature factor, are combined, preferably by a summing operation shown in block 120 with a previously determined state of life factor, $SOL_K$, to determine a parametric value for the SOL, i.e. $SOL_{K+1}$, which is shown as an output to block 120. The algorithm to determine the state of life factor, $SOL_K$, is preferably executed multiple times during each trip (defined as an engine on-off cycle). The resting temperature factor $T_{REST}$ preferably comprises a derived parametric value. As described hereinbelow, resting temperature factor $T_{REST}$ 116 is determined based upon a time-based temperature of the ESD 74 during quiescent periods of ESD operation. Quiescent periods of ESD operation are characterized by ESD power flow that is de minimus whereas active periods of ESD operation are characterized by ESD power flow that is not de minimus. That is to say, quiescent periods of ESD operation are generally characterized by no or minimal current flow into or out of the ESD. With respect to an ESD associated with a hybrid vehicle propulsion system for example, quiescent periods of ESD operation may be associated with periods of vehicle inactivity (e.g. powertrain, including electric machines, is inoperative such as during periods when the vehicle is not being driven and accessory loads are off but may include such periods characterized by parasitic current draws as are required for continuing certain controller operations including, for example, the operations associated with the present invention). Active periods of ESD operation in contrast may be associated with periods of vehicle activity (e.g. accessory loads are on and/or the powertrain, including electric machines, is operative such as during periods when the vehicle is being driven wherein current flows may be into or out of the ESD).

Figure 3:
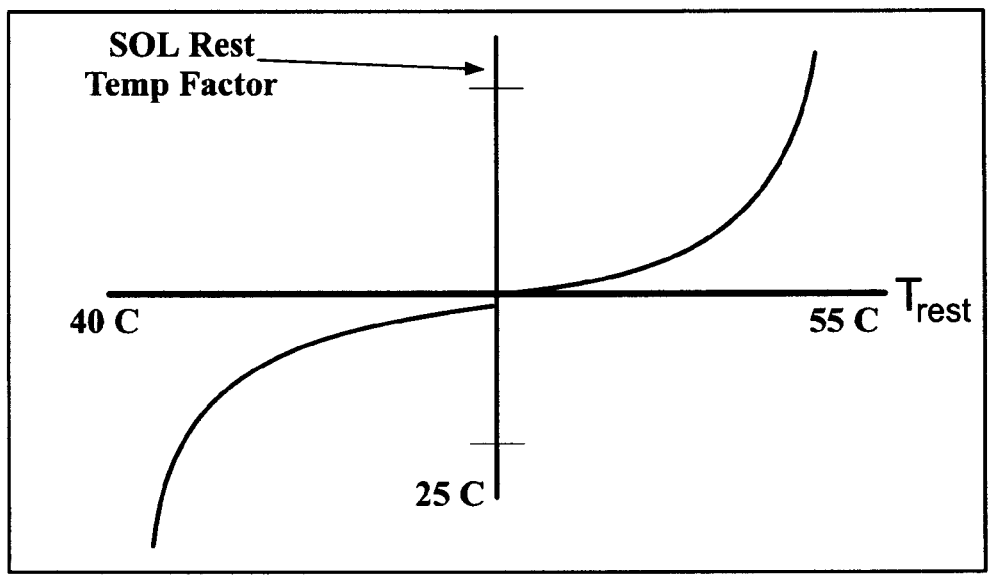

Referring now to FIG. 3, a method and system for determining the resting temperature factor 116 is now described. The method is preferably executed as one or more algorithms and associated calibrations in one of the aforementioned controllers, preferably the HCP 5. The method and system include determining a temperature of the electrical energy storage device when the device enters the quiescent period, determining an average temperature of the electrical energy storage device during the quiescent period, determining a weighted average temperature of the electrical energy storage device during the quiescent period based upon the average temperature and the shutdown temperature; and, determining a parametric value for the resting temperature factor 116, based upon the weighted average temperature, which is useable to adjust a life expectancy parameter of the electrical energy storage device. This is discussed in greater detail hereinbelow.

Determining temperature of the electrical energy storage device when the device enters the quiescent period preferably comprises capturing a value for ESD temperature, $T_{BAT}$ when the vehicle is shutdown by the operator, e.g. at a key-off event. Determining an average temperature of the electrical energy storage device during the quiescent period preferably comprises executing an algorithm to monitor ESD temperature, $T_{BAT}$ at regular intervals during the quiescent period, and calculating a running average value. Elapsed time during shutdown is monitored. A weighting factor is determined from the shutdown temperature, the average temperature, and the elapsed time. The weighting factor preferably comprises a curve having a nonlinear time decay based upon temperature of the system, with the decay factor based upon whether the system is heating or cooling. The weighting factor is determined by quantity of parametric measurements of temperature used to calculate the resting temperature factor (block 116). For example, when a large quantity of temperature samples are taken indicating a long resting time, the parametric value for resting temperature closely approximates actual temperature, and the resting temperature factor would comprise a time-average value of the resting temperature. The weighting factor is applied to the average temperature of the ESD during the quiescent period to determine a weighted average temperature during the quiescent period.

The resting temperature factor 116, useable for determining the aforementioned life expectancy parameter SOL of the electrical energy storage device, is determined based upon the weighted average temperature, as shown with reference to FIG. 3. FIG. 3 comprises a datagraph having temperature (degrees, C) as the on the X-axis, and parametric values for resting temperature factor 116 on the Y-axis. The curve comprises an exponential function having a nominal value, or zero point, at about 25 C. Establishing the nominal value for the resting temperature factor at a nominal temperature value of 25 C is preferable in the exemplary system because life-expectancy testing and data for the exemplary ESD 74 was conducted at an ambient temperature of 25 C. Therefore, a parametric value for nominal resting temperature factor 116 at 25 C is zero, and the parametric value changes for lower and higher resting temperatures. This includes increasing the resting temperature factor 116 when the weighted average temperature during the quiescent period is less than the nominal temperature value of 25 C, and decreasing the resting temperature factor 116 when the weighted average temperature during the quiescent period is greater than the nominal temperature value of 25 C.

As shown in FIG. 3, the resting temperature factor 116 increases exponentially with increasing weighted average temperature during the quiescent period, due to resulting decrease in life expectancy of typical ESD resulting at higher ambient and higher ESD operating temperatures. The resting temperature factor 116 decreases exponentially with decreasing weighted average temperature during the quiescent period, due to resulting increase in life expectancy of typical ESDs resulting at higher ambient and higher ESD operating temperatures. Specific calibration values for resting temperature factors 116 at various temperatures are application-specific, and depend upon design of the specific ESD, the design life-expectancy of the ESD, and operating characteristics of the hybrid system utilizing the ESD. The resting temperature factor 116 is an element of the control system for the aforementioned powertrain system.

Figure 4:
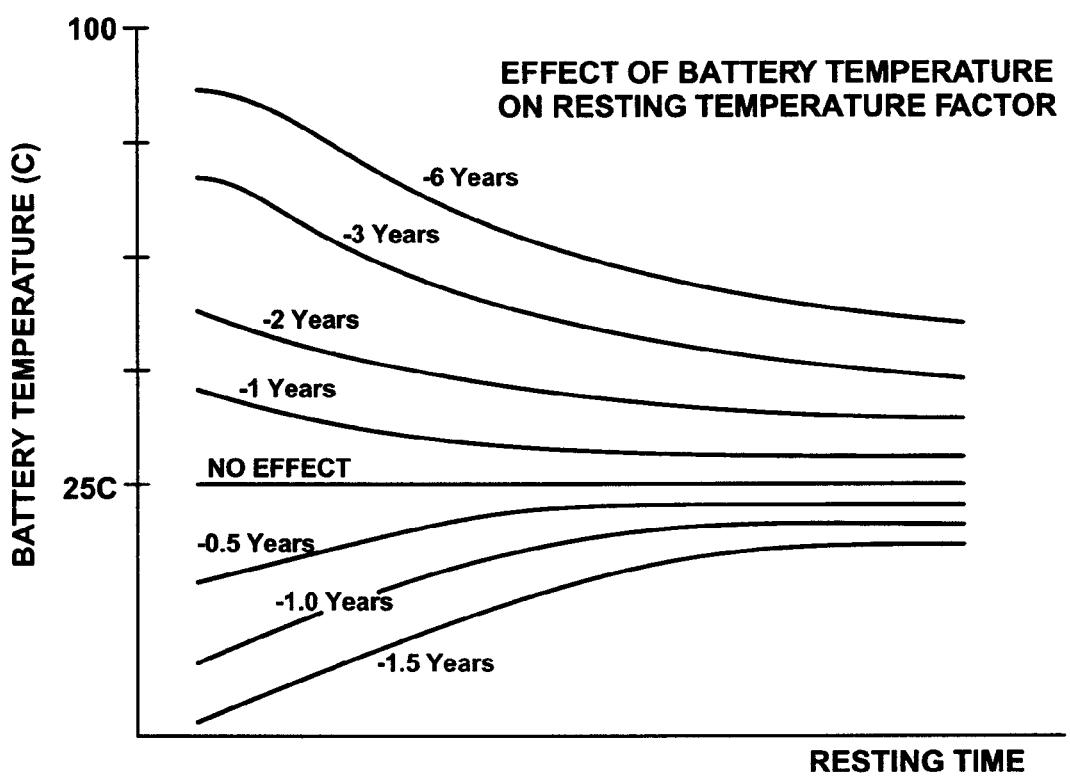

Referring now to FIG. 4, an exemplary datagraph is shown for a specific application, comprising an effect of ESD temperature on the resting temperature factor. Based upon an elapsed resting time and ESD temperature during the resting time, a resting temperature factor is determinable. The plotted lines comprise lines of equal effect, i.e. the lines reflect a time/temperature relationship that results in a similar change in ESD life. For example, a short elapsed time at a higher temperature has a similar effect on ESD life as a longer elapsed time at a lower temperature.

The invention has been described with specific reference to the preferred embodiments and modifications thereto. Further modifications and alterations may occur to others upon reading and understanding the specification. It is intended to include all such modifications and alterations insofar as they come within the scope of the invention.

Having thus described the invention, it is claimed:

1. Method for quantifying an effect of temperature during a quiescent period of an electrical energy storage device operation upon the electrical energy storage device, comprising:

determining a weighted average temperature of the electrical energy storage device during the quiescent period based upon an average temperature of the electrical energy storage device during the quiescent period and a temperature of the electrical energy storage device substantially contemporaneous with the start of the quiescent period; and, determining a resting temperature factor for the electrical energy storage device based upon the weighted average temperature of the device during the quiescent period.

2. The method of claim 1, wherein determining the resting temperature factor of the electrical energy storage device during the quiescent period based upon the weighted average temperature during the quiescent period further comprises decreasing a previously determined resting temperature factor when the weighted average temperature during the quiescent period is less than a nominal temperature.

3. The method of claim 2, further comprising exponentially decreasing the previously determined resting temperature factor based upon a difference between the weighted average temperature during the quiescent period and the nominal temperature.

4. The method of claim 1, wherein determining the resting temperature factor further comprises increasing a previously determined resting temperature factor when the weighted average temperature during the quiescent period is greater than a nominal temperature.

5. The method of claim 4, further comprising exponentially decreasing the previously determined resting temperature factor based upon a difference between the weighted average temperature during the quiescent period and the nominal temperature.

6. The method of claim 1, wherein determining the resting temperature factor further comprises maintaining the resting temperature factor at a nominal value when the weighted average temperature during the quiescent period is substantially equal to a nominal temperature.

7. The method of claim 1, wherein the device comprises a hybrid powertrain electrical energy storage device and the quiescent period comprises a period when the hybrid powertrain is disabled.

8. The method of claim 1, wherein the resting temperature factor is utilized to determine life expectancy of the electrical energy storage device.

9. The method of claim 8, wherein the determined life expectancy of the electrical energy storage device is utilized in a control system for a hybrid vehicle.

10. Method for quantifying an effect of temperature during a quiescent period of an electrical energy storage device operation upon a life expectancy of an electrical energy storage device, comprising:

determining a weighted average temperature of the electrical energy storage device during the quiescent period based upon an average temperature of the electrical energy storage device during the quiescent period and a temperature of the electrical energy storage device substantially contemporaneous with the start of the quiescent period; and, determining a change in a state of life parameter based upon the weighted average temperature of the electrical energy storage device.

11. Apparatus for quantifying an effect of temperature during a quiescent period of an electrical energy storage device operation upon the electrical energy storage device, comprising:

a temperature sensor adapted for sensing temperature of the energy storage device;

a computer based controller adapted to receive a signal indicative of sensed energy storage device temperature;

said computer based controller including a storage medium having a computer program encoded therein, said computer program comprising:

code for determining a weighted average temperature of the electrical energy storage device during the quiescent period based upon an average temperature of the electrical energy storage device during the quiescent period and a temperature of the electrical energy storage device substantially contemporaneous with the start of the quiescent period; and, code for determining a resting temperature factor for the electrical energy storage device based upon the weighted average temperature of the electrical energy storage device during the quiescent period.

12. The apparatus of claim 11, wherein code for determining the resting temperature factor further comprises code for decreasing a previously determined resting temperature factor when the weighted average temperature during the quiescent period is less than a nominal temperature.

13. The apparatus of claim 12, wherein the computer program further comprises code for exponentially decreasing the previously determined resting temperature factor based upon a difference between the weighted average temperature during the quiescent period and the nominal temperature.

14. The apparatus of claim 11, wherein code for determining the resting temperature factor further comprises code for increasing a previously determined resting temperature factor when the weighted average temperature during the quiescent period is greater than a nominal temperature.

15. The apparatus of claim 14, wherein the computer program further comprises code for exponentially decreasing the previously determined resting temperature factor based upon a difference between the weighted average temperature during the quiescent period and the nominal temperature.

16. The apparatus of claim 11, wherein code for determining the resting temperature factor further comprises code for maintaining the resting temperature factor at a nominal value when the weighted average temperature during the quiescent period is substantially equal to a nominal temperature.

* * * * *